(12) United States Patent
Abeywickrama et al.

(10) Patent No.: US 10,416,209 B2
(45) Date of Patent: Sep. 17, 2019

(54) METHOD AND SYSTEM FOR MEASURING POWER LOSS IN A POWER TRANSFORMER

(71) Applicant: ABB Schweiz AG, Baden (CH)

(72) Inventors: Nilanga Abeywickrama, Västerås (SE); Svante Karlsson, Solna (SE); Tord Bengtsson, Västerås (SE)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 16/075,858

(22) PCT Filed: Feb. 13, 2017

(86) PCT No.: PCT/EP2017/053137
§ 371 (c)(1),
(2) Date: Aug. 6, 2018

(87) PCT Pub. No.: WO2017/140616
PCT Pub. Date: Aug. 24, 2017

(65) Prior Publication Data
US 2019/0041437 A1    Feb. 7, 2019

(30) Foreign Application Priority Data
Feb. 18, 2016 (EP) ..................... 16156395

(51) Int. Cl.
*G01R 21/133* (2006.01)
*G01R 19/25* (2006.01)
(Continued)

(52) U.S. Cl.
CPC ..... *G01R 21/1331* (2013.01); *G01R 19/2513* (2013.01); *G01R 21/133* (2013.01); *G01R 31/027* (2013.01); *G01R 29/20* (2013.01)

(58) Field of Classification Search
CPC ............ G01R 21/1331; G01R 19/2513; G01R 31/027; G01R 29/20
(Continued)

(56) References Cited

U.S. PATENT DOCUMENTS 3,732,489 A * 5/1973 Nelson ................... G01R 29/20
324/601
6,809,525 B1 * 10/2004 Sampat ............... G01R 31/027
324/546
(Continued)

FOREIGN PATENT DOCUMENTS

EP    2474832 A2    7/2012

OTHER PUBLICATIONS

Dunfee, Bernadine L. "The design and performance of multirange current transformer standards for audio frequencies." IEEE Transactions on Instrumentation and Measurement 14.4 (1965): 190-204. (Year: 1965) (Year: 1965).*
(Continued)

*Primary Examiner* — Christopher P McAndrew
(74) *Attorney, Agent, or Firm* — Whitmyer IP Group LLC

(57) ABSTRACT

A system and a method for determining the power loss of a transformer. The method includes measuring voltage and current at the primary side of the transformer, calculating input power by multiplying the measured current and voltage on the primary side of the transformer; measuring voltage and current at the secondary side of the transformer, calculate a nominal error ratio, calculating output power by multiplying the measured current and voltage on the secondary side of the transformer. The method further involves calculating a first corrected power loss by means of multiplying the input power with the nominal error ratio and subtract the output power.

10 Claims, 2 Drawing Sheets

(51) Int. Cl.
*G01R 31/02* (2006.01)
*G01R 29/20* (2006.01)

(58) Field of Classification Search
USPC ......................................................... 324/142
See application file for complete search history.

(56) References Cited

U.S. PATENT DOCUMENTS

| | | | | |
|---|---|---|---|---|
| 2006/0247874 A1* | 11/2006 | Premerlani | ........ | G01R 19/2513 702/64 |
| 2007/0086134 A1* | 4/2007 | Zweigle | ............ | G01R 19/2513 361/85 |
| 2008/0036472 A1* | 2/2008 | Collins, Jr. | ........ | G01R 19/2513 324/649 |
| 2010/0161263 A1* | 6/2010 | Benmouyal | ........ | G01R 19/2513 702/72 |
| 2011/0077885 A1* | 3/2011 | Zweigle | ............ | G01R 19/2513 702/66 |
| 2013/0282312 A1* | 10/2013 | Abeywickrama | .... | G01R 31/027 702/58 |

OTHER PUBLICATIONS

Kwon, Jung-Min, and Bong-Hwan Kwon. "High step-up active-clamp converter with input-current doubler and output-voltage doubler for fuel cell power systems." IEEE Transactions on Power Electronics 24.1 (2009): 108-115. (Year: 2009) (Year: 2009).*
European Search Report Application No. EP 16156395.2 Completed: Aug. 11, 2016; dated Aug. 19, 2016 8 pages.
International Search Report and Written Opinion of the International Searching Authority Application No. PCT/EP2017/053137 Completed: May 15, 2017; dated May 30, 2017 14 pages.
Dragana Naumovic-Vukovic: "On-site Measurement of Load and No-load Losses of GSU Transformer", Proceedings of the 15th WSEAS International Conference on Systems. Corfu Islands, Greece, Jul. 14-17, 2011, Jul. 6, 2011 Internet:http://www.wseas.us/e-library/conferences/2011/Corfu/SYSTEMS/SYSTEMS-79.pdf 6 pages.

* cited by examiner

METHOD AND SYSTEM FOR MEASURING POWER LOSS IN A POWER TRANSFORMER

TECHNICAL FIELD

The embodiments described herein relates to methods and systems for determining power loss in transformers, and in particular to a method and a system for determining power loss in a power transformer, which involves correction of sensor measurements.

BACKGROUND

A high power transformer always has some power losses during operation. It is very important to have these losses under control and monitor them frequently in order to have an early indicator of transformer problems and malfunctions. In theory it is easy to monitor the power losses by means of measuring the input power to the primary side of the transformer and measuring the output power at the secondary side of the transformer. The difference between the input power and the output power is due to transformer losses. A common measurement setup for measuring power loss involves a current sensor and a voltage sensor on both the primary side and the secondary side of the power transformer.

In reality, the measured voltage and current signals are always associated with a systematic error due to the accuracy of the measurement setup. This gives the measured voltage:

$$\tilde{V} = V + V_{err} = (1+\varepsilon_V) \cdot V \quad (eq1)$$

Where $\varepsilon_V$ is a complex number representing the error in the voltage measurement. In a similar way, the measured current can be written as:

$$\tilde{I} = I + I_{err} = (1+\varepsilon_I) \cdot I \quad (eq2)$$

Where, $\varepsilon_I$ is a complex number representing the error in the current measurement. This means that a measured power loss is not equal to the true power loss, and the measured power loss is:

$$\tilde{S}_{loss} = \tilde{V}_H \cdot \tilde{I}_H^* - \tilde{V}_L \cdot \tilde{I}_L^* \quad (eq3)$$

By insertion of the above equations (eq1, eq2) into (eq3), an expression for the measured power loss is obtained:

$$\tilde{S}_{loss} = (1+\varepsilon_{VH})(1+\varepsilon_{IH})^* V_H I_H^* - (1+\varepsilon_{VL})(1+\varepsilon_{IL})^* V_L I_L^* \quad (eq4)$$

The above equation (eq4) may be used to calculate the true power loss, but there are some numerical problems associated with the above equation (eq4) due to the difference calculation. Calculation of a difference between two large numbers that are approximately equal to each other causes increased numerical errors. If the above equation for calculation of the power loss is used, some non-physical relations such as a power loss that decreases with loading and negative power loss may be observed.

EP 2 474 832 A2 discloses a method, system and computer program product for determining the health of a transformer. The method includes computing an effective turns ratio based on a primary electrical parameter associated with a primary winding of the transformer and a secondary electrical parameter associated with a secondary winding of the transformer. The method further includes computing an operational magnetizing current based on the effective turns ratio and primary and secondary currents of the transformer or primary and secondary voltages of the transformer. Finally, the method includes determining an inter-turn winding health indicator based at least in part on the operational magnetizing current.

U.S. Pat. No. 6,809,525 B1 discloses method for estimating conductor losses in a transformer having a first and a second winding includes energizing the first winding while the second winding is short-circuited by an electrical conductor so that power is supplied to the first winding and a portion of the power is dissipated due to a resistance associated with the electrical conductor. The method also includes measuring the power supplied to the first winding, calculating the portion of the power dissipated due to the resistance associated with the electrical conductor, and subtracting the portion of the power dissipated due to the resistance associated with the electrical conductor from the power supplied to the first winding.

SUMMARY

It is an object to provide a method and an apparatus, which improves the accuracy in determining the power loss of a transformer.

It is an object to provide a method that obviates the above mentioned problems and provides a more accurate and robust method for determining the power loss of a transformer. The above stated object is achieved by means of a method and apparatus according to the independent claims.

A first embodiment provides a method for determining power loss in a transformer, The method comprises measuring voltage and current ($\tilde{V}_H$, $\tilde{I}_H$) at the primary side of the transformer, calculating input power by multiplying the measured current and voltage on the primary side of the transformer. The method further comprises measuring voltage and current ($\tilde{V}_L$, $\tilde{I}_L$) at the secondary side of the transformer, calculating a nominal error ratio. The method further comprises calculating output power by multiplying the measured current and voltage on the secondary side of the transformer. The method further comprises calculating a first corrected power loss by means of multiplying the input power with the nominal error ratio and subtract the output power.

A second embodiment provides a system for determining power loss in a transformer. The system comprises an input voltage measurement apparatus and an input current measurement apparatus configured to be connected to a primary winding terminal of a transformer, and an output current measurement apparatus and an output voltage measurement apparatus configured to be connected to a secondary winding terminal of the transformer. The system further comprises a calculation device configured to be connected to the input current measurement apparatus, the input voltage measurement apparatus, the output current measurement apparatus, and the output voltage measurement apparatus. The calculation device is configured to receive information about each measurement, which comprises measured voltages and currents. The calculation device is further configured to calculate the input power by multiplying the measured current and voltage of the primary side of the transformer, calculate a nominal error ratio, calculate the output power by multiplying the measured output current and output voltage on the secondary side of the transformer. The calculation device is further configured to calculate a first corrected power loss by means of multiplying the input power with the nominal error ratio and subtract the output power.

An advantage of certain embodiments described herein is that they make it possible to determine the power loss of a transformer accurately.

Another advantage of some embodiments described herein is that they circumvent the numerical problem associated with calculating a difference between two large numbers that are almost equal each other.

Further advantages and features of embodiments of the present invention will become apparent when reading the following detailed description in conjunction with the drawings.

DETAILED DESCRIPTION

The present invention will now be described more fully hereinafter with reference to the accompanying drawings, in which different exemplary embodiments are shown. These exemplary embodiments are provided so that this disclosure will be thorough and complete and not for purposes of limitation.

Figure 1:
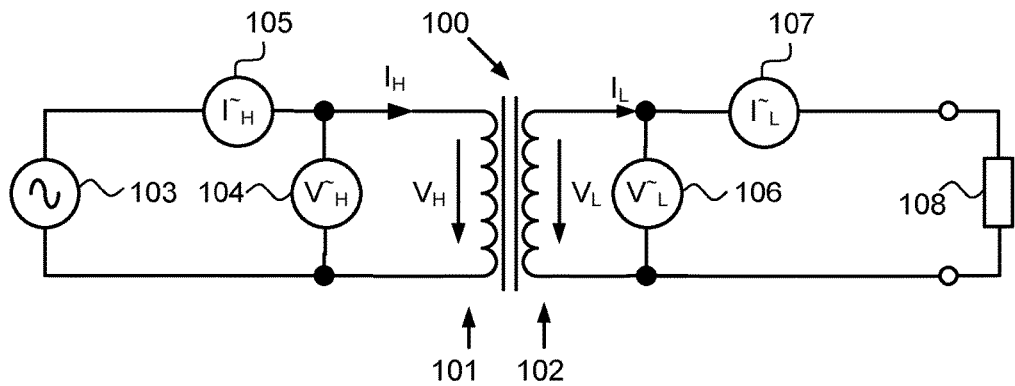
FIG. 1 is a schematic circuit diagram of a transformer and a circuit for determining power loss.

FIG. 1 illustrates an example of a transformer 100 having a primary winding 101 and a secondary winding 102. The primary winding 101 is connected to a voltage source 103, which supplies the transformer with input power. A primary voltage measurement apparatus 104 is connected to the primary winding 101 of the transformer 100 for measuring the voltage over the primary winding 101. In addition a primary current measurement apparatus 105 is connected to the primary winding for measuring the input current $I_H$ that flows into the transformer from the voltage source 103. The measured input current is designated $\tilde{I}_H$. In one embodiment the voltage source 103 may be a power grid. In this FIG. 1 the voltage $V_H$ over the primary winding 101 is measured by the voltage measurement apparatus 104, but the measured voltage $\tilde{V}_H$ is not equal to the voltage $V_H$ due to systematic errors in the voltage measurement apparatus 104. On the secondary side, a voltage measurement apparatus 106 is connected and configured to measure the voltage $V_L$ over the secondary winding 102 of the transformer 100. The measured output voltage is designated $\tilde{V}_L$. A current measurement apparatus 107 is configured to measure the output current $I_L$ and the measured current is designated $\tilde{I}_L$, which is not equal to the output current $I_L$ due to systematic errors in the current measurement apparatus 107. In this figure, a load 108 is also illustrated.

In a preferred embodiment, the transformer is a three-phase transformer with three primary windings and three secondary windings.

The calculated input power $(\tilde{S}_{in})$ is calculated as the product of the measured voltage $\tilde{V}_H$ and the complex conjugate of the measured current $\tilde{I}_H^*$:

$$\tilde{S}_{in} = \tilde{V}_H \cdot \tilde{I}_H^* \tag{eq1}$$

However, this calculated input power $\tilde{S}_{in}$ is not the true input power due to systematic errors in the measuring apparatus 104, 105 as discussed above. A reasonable description of the systematic error may be obtained by means of a complex number for each measurement value used in the calculation. This gives that the systematic errors in the measurement apparatus can be described with a complex constant epsilon, which gives the following equation for the measured voltage:

$$\tilde{V}_H = (1+\varepsilon_{VH}) \cdot V_H \tag{eq2}$$

Where $V_H$ is the true voltage over the primary winding of the transformer, and $\varepsilon_{VH}$ is a complex constant, which describes the error in the voltage measurement of the voltage over the primary winding of the transformer.

A corresponding equation for the complex conjugate of the current can be derived:

$$\tilde{I}_H^* = (1+\varepsilon_{IH})^* \cdot I_H^* \tag{eq3}$$

Where $I_H$ is the true current and $\varepsilon_{IH}$ is a complex constant that describes the error in the input current measurement.

Insertion of the equations (eq2, eq3) into the equation for the input power (eq1) gives:

$$\tilde{S}_{in} = \tilde{V}_H \cdot \tilde{I}_H^* = (1+\varepsilon_{VH}) \cdot (1+\varepsilon_{IH})^* \cdot V_H \cdot I_H^* \tag{eq4}$$

The calculated output power $\tilde{S}_{out}$ from the transformer may be calculated in a similar way:

$$\tilde{S}_{out} = \tilde{V}_L \cdot \tilde{I}_L^* \tag{eq5}$$

Where, $\tilde{V}_L$ is the measured voltage over the secondary winding of the transformer and $\tilde{I}_L^*$ is the complex conjugate of the measured current from the secondary winding of the transformer.

The measured voltage $\tilde{V}_L$ and complex conjugate of the current $\tilde{I}_L^*$ can be written as:

$$\tilde{V}_L = (1+\varepsilon_{VL}) \cdot V_L \tag{eq6}$$

$$\tilde{I}_L^* = (1+\varepsilon_{IL})^* \cdot I_L^* \tag{eq7}$$

Where $V_L$ is the true voltage over the secondary winding and $\varepsilon_{VL}$ is a complex number that is representative of the systematic error in the measured voltage over the secondary winding. $I_L^*$ is the complex conjugate of the true current from the secondary winding of the transformer, and finally $\varepsilon_{IL}$ is a complex number which is representative of the systematic error in the measured current $\tilde{I}_L$ from the secondary winding of the transformer.

This gives that the output power $\tilde{S}_{out}$ can be written as (eq5, eq6, and eq7):

$$\tilde{S}_{out} = \tilde{V}_L \cdot \tilde{I}_L^* = (1+\varepsilon_{VL}) \cdot (1+\varepsilon_{IL})^* \cdot V_L \cdot I_L^* \tag{eq8}$$

The estimated power loss of the transformer is:

$$\tilde{S}_{loss} = \tilde{S}_{in} - \tilde{S}_{out} \tag{eq9}$$

If the above equation (eq9) is used together with the above-expressions for the input and output power (eq8, eq4) an expression for the power losses can be derived:

$$\tilde{S}_{loss} = (1+\varepsilon_{VH}) \cdot (1+\varepsilon_{IH})^* \cdot V_H \cdot I_H^* - (1+\varepsilon_{VL}) \cdot (1+\varepsilon_{IL})^* \cdot V_L \cdot I_L^* \tag{eq10}$$

However, due to the systematic errors in the measurements this power loss $\tilde{S}_{loss}$ is not equal to the true power loss. As the systematic errors often are of the same size or larger than the power loss fraction of the total power, the error in $\tilde{S}_{loss}$ may be several times the true loss.

The present invention is based on the idea that by introducing correction factors for the voltage measurements and the current measurements, the calculation of a difference between two large almost equal large numbers can be made less influenced by sensor errors and thus closer to the true value.

A first correction factor may be introduced for correcting current measurements. This is reasonable since current measurements usually are associated with the highest systematic errors.

The ratio n between the number of turns in the primary winding and the secondary winding is related to the input current and the output current as:

$$n = I_L/(I_H - I_0) \quad (eq11)$$

The turn's ratio, n, of a transformer is a very stable and precise quantity that only will change if there are severe problems with the transformer. If it is concluded or assumed that no such problems exist, the measured ratio $n^\sim$ reflects only the current measurement errors.

Where, $I_0$ is the magnetization current of the transformer. A measurement of the input current and the output current yields a measured ratio $n^\sim$ as:

$$n^\sim = I^\sim_L/(I^\sim_H - I_0) = I_L \cdot (1+\varepsilon_{IL})/(I_H \cdot (1+\varepsilon_{IH}) - I_0) \quad (eq12)$$

The first correction factor is derived by calculating a nominal error ratio, also referred to as current error ratio, as:

$$n^\sim/n = (1+\varepsilon_{IL})/(1+\varepsilon_{IH}) \quad (eq13)$$

The magnetization current $I_0$ is neglected since it is small compared to $I_H$ and $I^\sim_H$.

The first correction factor is the complex conjugate of $n^\sim/n$ and is used to correct the measured input power in the equation (eq10) for the measured power loss. This gives:

$$S^\sim_{loss,corr1} = (n^\sim/n)^* \cdot (1+\varepsilon_{VH}) \cdot (1+\varepsilon_{IH})^* \cdot V_H \cdot I_H^* - (1+\varepsilon_{VL})(1+\varepsilon_{IL}) \cdot V_L \cdot I_L^* = (1+\varepsilon_{IL})^* \cdot ((1+\varepsilon_{VH}) \cdot V_H \cdot I_H^* - (1+\varepsilon_{VL}) \cdot V_L \cdot I_L^*) \quad (eq14)$$

Equation (eq14) indicates that the error due to current measurements now influences the power loss only by a factor of the accuracy class of the current sensors.

Similarly, a second correction factor may be introduced that relates to the error in the voltage measurements. The voltage relation for an equivalent circuit of the transformer is $V_H - Z_e \cdot I_H = V_L \cdot n$, which gives:

$$V_H/V_L = n + (Z_e \cdot I_H)/VL \quad (eq15)$$

Where $Z_e$ is the short-circuit impedance referred to the primary side of the transformer.

Furthermore, the ratio of the measured voltages on the primary side and the secondary side may be calculated as follows:

$$V^\sim_H/V^\sim_L = V_H \cdot (1+\varepsilon_{VH})/(V_L \cdot (1+\varepsilon_{VL})) = (n+(Z_e \cdot I_H)/VL) \cdot (1+\varepsilon_{VH})/(1+\varepsilon_{VL}) \quad (eq16)$$

The voltage ratio between the ratio of the measured voltage and the ratio of the true voltage is obtained from the above equations (eq15, eq16).

$$(V^\sim_H/V^\sim_L)/(V_H/V_L) = (1+\varepsilon_{VH})/(1+\varepsilon_{VL}) \quad (eq17)$$

This second correction factor is multiplied with the second term, related to the output power, inside the parenthesis of the equation (eq14). This gives an expression for a second corrected power loss:

$$S^\sim_{loss,corr2} = (1+\varepsilon_{VL})^* \cdot (1+\varepsilon_{VH}) \cdot (V_H \cdot I_H^* - V_L \cdot I_L^*) \quad (eq18)$$

The second corrected power loss (eq18) contains an error in percent range of the actual loss compared to the error in the equation (eq10) above, which is much larger and in the percent of the actual power flowing through the transformer.

Figure 2:
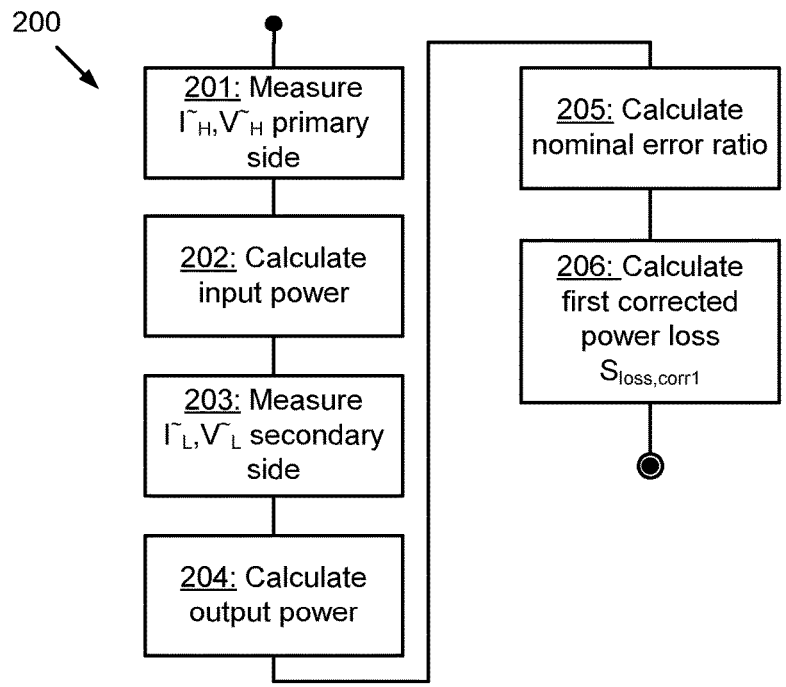
FIG. 2 is a flow diagram illustrating an embodiment of a method for determining power loss in a transformer.

In FIG. 2 a flow diagram, illustrating an embodiment of a method for determining power loss is shown. The method for determining power loss in a transformer, comprising:

201: Measuring voltage $V^\sim_H$ and current $I^\sim_H$ at the primary side of the transformer.

202: Calculating input power by multiplying the measured current and voltage on the primary side of the transformer.

203: Measuring voltage $V^\sim_L$ and current $I^\sim_L$ at the secondary side of the transformer;

204: Calculating output power by multiplying the measured current and voltage on the secondary side of the transformer. This corresponds to the calculation in equation (eq5).

205: Calculate a nominal error ratio. In a preferred embodiment, this involves using equation (eq13) and the errors for the current measurement on the primary side and the secondary side ($\varepsilon_{IH}$, $\varepsilon_{IL}$).

206: Calculate a first corrected power loss by means of multiplying the input power with the nominal error ratio and subtract the output power. This step corresponds to the calculation in equation (eq14).

According to some embodiments, an additional step of calculating a voltage error ratio is performed, and the calculation of the corrected power loss further involves multiplying the output power with the voltage error ratio. The voltage error ratio may be calculated using equation (eq17).

Figure 3:
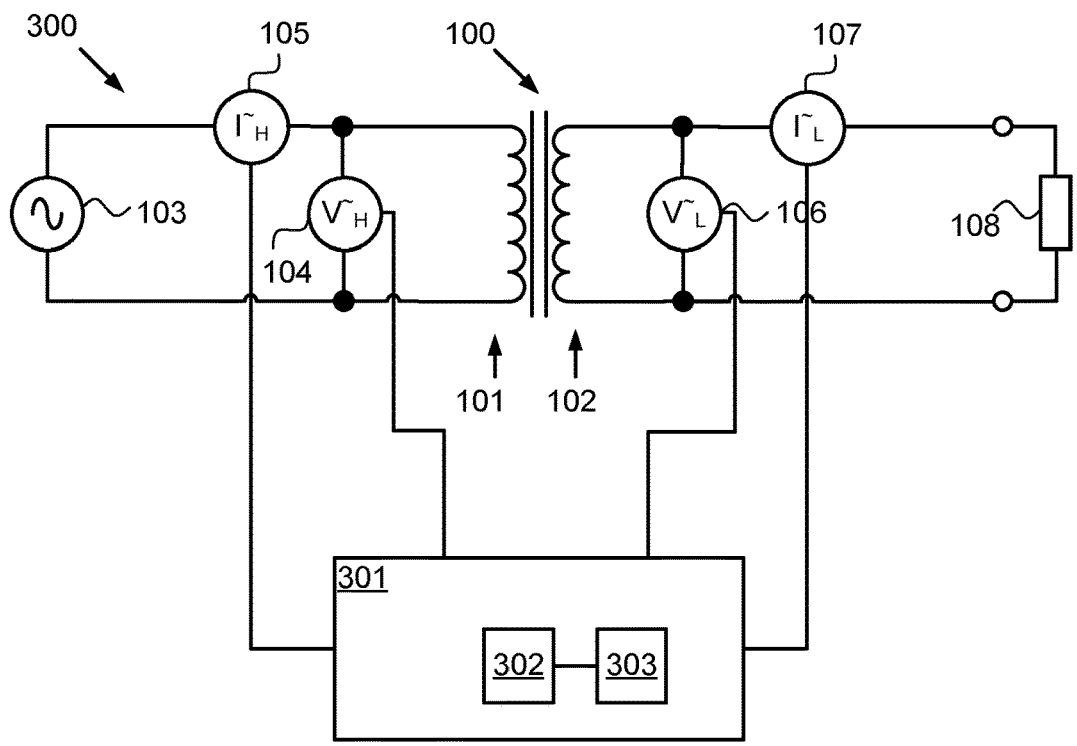
FIG. 3 is a schematic block diagram illustrating an embodiment of a system for determining power loss in a transformer.

FIG. 3 illustrates schematically a system, generally designated 300, for determining power loss of a transformer.

The system 300 comprising an input voltage measurement apparatus 104 and an input current measurement apparatus 105 configured to be connected to a primary winding 101 of a transformer 100, and an output current measurement apparatus 107 and an output voltage measurement apparatus 106 configured to be connected to a secondary winding 102 of the transformer 100. The system 300 further comprises a calculation device 301 configured to be connected to the input current measurement apparatus 105, the input voltage measurement apparatus 104, the output current measurement apparatus 107, and the output voltage measurement apparatus 106.

The calculation device 301 is configured to receive information about each measurement, which comprises measured voltages and currents. The calculation device 301 is configured to calculate the input power by multiplying the measured current and voltage of the primary side of the transformer, calculate a nominal error ratio. The calculation device is further configured to calculate the output power by multiplying the measured output current and output voltage on the secondary side of the transformer, calculate a first corrected power loss by means of multiplying the input power with the nominal error ratio and subtract the output power.

In a preferred embodiment, the calculation of the nominal error ratio is performed by means of equation (eq13) and the complex correction factors for the input current measurement apparatus and the output current measurement apparatus.

In a preferred embodiment, the calculation device calculates a voltage error ratio by means of equation (eq17) and the complex correction factors for the input voltage measurement apparatus and the output voltage measurement apparatus. The calculation device further calculates a second corrected power loss according to equation (eq18), which further involves multiplying the output power with the voltage error ratio. The second corrected power loss takes both the errors in the current measurement apparatuses and the voltage measurement apparatuses into account.

In one embodiment, the calculation device 301 further comprises a processor 302 and a memory 303. The memory comprises computer readable instructions for the processor, such that when the instructions are executed by the processor the method as disclosed above with reference to FIG. 2 is performed.

In another embodiment, the processor receives instructions from a signal that comprises computer readable instructions for the processor, such that when the instructions are executed by the processor the method as disclosed above with reference to FIG. 2 is performed.

Figure 4:
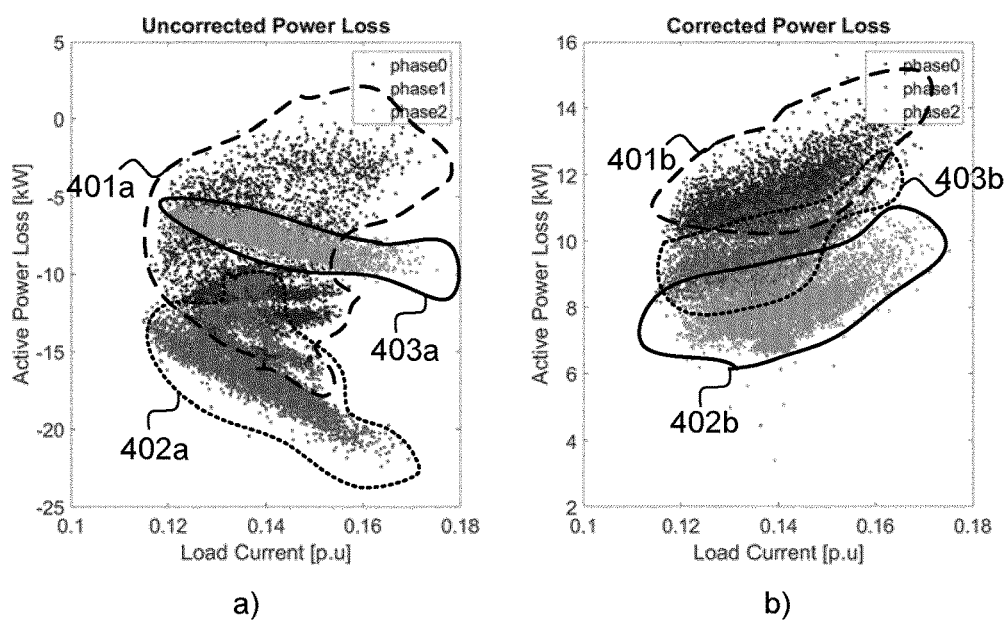
FIG. 4 is an experimental graph of power loss determined by means of an embodiment of a method for determining power loss in a transformer.

In the following with reference made to FIG. 4, an experiment will be disclosed that shows the beneficial effects of embodiments of the method and in particular the embodiments related to the second corrected power loss as described above.

FIG. 4a shows measurement of the uncorrected power loss from a three-phase transformer with a rated power of 56 MVA. The horizontal axis is the load current and the vertical axis is the power loss. In this FIG. 4a, three clusters of measurements are visible. A first cluster 401 corresponds to phase 0, a second cluster 402 corresponds to phase 1, and a third cluster 403 corresponds to phase 2. From this figure, several non-physical properties can be identified. First, for all three clusters the power loss is negative, which means that output power is larger than input power. Second, the power loss decreases with load current, which also is non-physical.

In FIG. 4b, a corrected power loss is disclosed. The corrected power loss in FIG. 4b is calculated using the method for estimating a second corrected power loss. In this figure the same three clusters as in FIG. 4a) are illustrated corrected. A corrected first cluster 401b corresponds to the first cluster 401a, a corrected second cluster 402b corresponds to the second cluster 402a, and a corrected third cluster 403b corresponds to the third cluster 403a. In this figure, all clusters provide positive power loss and a power loss that increases with load current. By using a simple rule of thumbs calculation the power loss is estimated to be 0.5% of the load, this gives approximately 13 kW for a 56 MVA transformer. This estimation corresponds reasonable well to the power losses of the three clusters.

From the description above it is apparent that an advantage of some embodiments described above is that they make it possible to achieve a surprisingly good estimate of the measured power loss.

Another advantage of some embodiments described herein is that they can easily be integrated and implemented in existing power plants.

In the drawings and specification, there have been disclosed typical embodiments and, although specific terms are employed, they are used in a generic and descriptive sense only and not for purposes of limitation, the scope of the invention being set forth in the following claims.

The invention claimed is:

1. A method for determining power loss in a transformer, comprising:
   measuring voltage and current at a primary side of the transformer;
   calculating input power by multiplying the measured current and voltage on the primary side of the transformer;
   measuring voltage and current at a secondary side of the transformer;
   calculating output power by multiplying the measured current and voltage on the secondary side of the transformer;
   calculating a nominal error ratio;
   calculating a first corrected power loss by means of multiplying the input power with a first correction factor which is the complex conjugate of the nominal error ratio and subtract the output power;
   wherein the nominal error ratio $n^\sim/n$ is:

$$n^\sim/n = (1+\varepsilon_{IL})/(1+\varepsilon_{IH})$$

where $\varepsilon_{IL}$ is a complex number representing the error in the current measurement on the secondary side of the transformer, and $\varepsilon_{IH}$ is a complex number representing the error in the current measurement on the primary side of the transformer.

2. The method according to claim 1, further including:
   calculating a voltage error ratio; and
   wherein the calculation of the corrected power loss further involves multiplying the output power with the voltage error ratio.

3. The method according to claim 2, wherein the voltage error ratio is:

$$(V^\sim_H/V^\sim_L)/(V_H/V_L) = (1+\varepsilon_{VH})/(1+\varepsilon_{VL})$$

where $\varepsilon_{VL}$ is a complex number representing the error in the voltage measurement on the secondary side of the transformer, and $\varepsilon_{VH}$ is a complex number representing the error in the voltage measurement on the primary side of the transformer.

4. A system for determining power loss in a transformer, including:
   an input voltage measurement apparatus and an input current measurement apparatus configured to be connected to a primary winding of a transformer(100), and
   an output current measurement apparatus and an output voltage measurement apparatus configured to be connected to a secondary winding of the transformer;
   a calculation device configured to be connected to the input current measurement apparatus, the input voltage measurement apparatus, the output current measurement apparatus, and the output voltage measurement apparatus, the calculation device is configured to receive information about each measurement, which includes measured voltages and currents, wherein the calculation device is configured to:
   calculate the input power by multiplying the measured current and voltage of the primary side of the transformer;
   calculate a nominal error ratio;
   calculate the output power by multiplying the measured output current and output voltage on the secondary side of the transformer;
   calculate a first corrected power loss by means of multiplying the input power with a first correction factor which is the complex conjugate of the nominal error ratio and subtract the output power,
   wherein the calculation device is configured to calculate the nominal error ratio as:

$$n^\sim/n = (1+\varepsilon_{IL})/(1+\varepsilon_{IH})$$

where $\varepsilon_{IL}$ is a complex number representing the error in the current measurement on the secondary side of the transformer, and $\varepsilon_{IH}$ is a complex number representing the error in the current measurement on the primary side of the transformer.

5. The system according to claim 4, wherein the calculation device further is configured to:
   calculate a voltage error ratio; and
   wherein the calculation of the corrected power loss further involves multiplying the output power with the voltage error ratio.

6. The system according to claim 5, wherein the calculation device further is configured to calculate the voltage error ratio as:

$$(V^{\sim}_H/V^{\sim}_L)/(V_H/V_L)=(1+\varepsilon_{VH})/(1+\varepsilon_{VL})$$

where $\varepsilon_{VL}$ is a complex number representing the error in the voltage measurement on the secondary side of the transformer, and $\varepsilon_{VH}$ is a complex number representing the error in the voltage measurement on the primary side of the transformer.

7. A non-transitory computer readable media containing instructions for a processor, such that when the instructions are executed by the processor, the processor performs a method for determining power loss in a transformer, the method including:
measuring voltage and current at a primary side of the transformer;
calculating input power by multiplying the measured current and voltage on the primary side of the transformer;
measuring voltage and current at a secondary side of the transformer;
calculating output power by multiplying the measured current and voltage on the secondary side of the transformer;
calculating a nominal error ratio;
calculating a first corrected power loss by means of multiplying the input power with a first correction factor which is the complex conjugate of the nominal error ratio and subtract the output power;
wherein the nominal error ratio $n^{\sim}/n$ is:

$$n^{\sim}/n=(1+\varepsilon_{IL})/(1+\varepsilon_{IH})$$

where $\varepsilon_{IL}$ is a complex number representing the error in the current measurement on the secondary side of the transformer, and $\varepsilon_{IH}$ is a complex number representing the error in the current measurement on the primary side of the transformer.

8. The method according to claim 1, further including: using the first corrected power loss to monitor the transformer and to detect a problem or malfunction in the transformer.

9. The system according to claim 4, wherein the calculation device detects a problem or malfunction in the transformer based on the first corrected power loss.

10. The non-transitory computer readable media according to claim 7, wherein the processor detects a problem or malfunction in the transformer based on the first corrected power loss.

* * * * *